(12) United States Patent
Zhang et al.

(10) Patent No.: US 11,011,819 B2
(45) Date of Patent: May 18, 2021

(54) DIRECTIONAL COUPLER AND METHOD FOR MANUFACTURING THE SAME AS WELL AS RADIO TRANSMITTER AND RADIO DEVICE

(71) Applicant: Telefonaktiebolaget LM Ericsson (publ), Stockholm (SE)

(72) Inventors: Xiaoqin Zhang, Nanjing (CN); Yilin Chen, Nanjing (CN); Jun Ding, Nanjing (CN); Xiaolong Pan, Nanjing (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/636,156

(22) PCT Filed: Sep. 14, 2017

(86) PCT No.: PCT/CN2017/101725
§ 371 (c)(1),
(2) Date: Feb. 3, 2020

(87) PCT Pub. No.: WO2019/051709
PCT Pub. Date: Mar. 21, 2019

(65) Prior Publication Data
US 2020/0203795 A1  Jun. 25, 2020

(51) Int. Cl.
*H01P 5/18* (2006.01)
*H03F 1/02* (2006.01)
(Continued)

(52) U.S. Cl.
CPC .............. *H01P 5/18* (2013.01); *H03F 1/0288* (2013.01); *H03F 1/3241* (2013.01); *H03F 3/21* (2013.01);
(Continued)

(58) Field of Classification Search
CPC ................................ H01P 5/18; H04B 1/0483
See application file for complete search history.

(56) References Cited

U.S. PATENT DOCUMENTS

2002/0101301 A1* 8/2002 Chiang ................... H01P 1/185
333/164
2002/0113666 A1* 8/2002 Yamazaki ............... H01P 5/187
333/109
(Continued)

FOREIGN PATENT DOCUMENTS

EP         3026441 A1     6/2016
WO      2017151321 A1     9/2017

OTHER PUBLICATIONS

Bahl, I.J., "Simple and Accurate Formulas for a Microstrip with Finite Strip Thickness", Proceedings of the IEEE, vol. 65, No. 11, Nov. 1977, pp. 1611-1612.
(Continued)

*Primary Examiner* — Hsinchun Liao
(74) *Attorney, Agent, or Firm* — Murphy, Bilak & Homiller, PLLC

(57) ABSTRACT

A directional coupler and a method for manufacturing the same are disclosed. According to an embodiment, the directional coupler comprises a first transmission line configured to receive an input signal. The directional coupler further comprises a second transmission line that can be coupled to the first transmission line by electromagnetic coupling to output a coupled signal. The first transmission line is further configured to act as a quarter-wave impedance transformer. A radio transmitter comprising the directional coupler and a radio device comprising the radio transmitter are also disclosed.

12 Claims, 6 Drawing Sheets

(51) Int. Cl.
*H03F 1/32* (2006.01)
*H03F 3/21* (2006.01)
*H04B 1/04* (2006.01)

(52) U.S. Cl.
CPC ..... *H04B 1/0483* (2013.01); *H03F 2200/451* (2013.01)

(56) References Cited

U.S. PATENT DOCUMENTS

| | | |
|---|---|---|
| 2011/0169590 A1 | 7/2011 | Namerikawa et al. |
| 2012/0062322 A1* | 3/2012 | Owen ............... H03F 3/211 330/296 |
| 2013/0063208 A1 | 3/2013 | Acimovic |
| 2013/0063222 A1* | 3/2013 | Acimovic ............ H01P 5/184 333/27 |

OTHER PUBLICATIONS

Pozer, David M., "Microwave Engineering", 4th Edition, John Wiley & Sons, Inc., 2012, pp. 1-756.

\* cited by examiner

DIRECTIONAL COUPLER AND METHOD FOR MANUFACTURING THE SAME AS WELL AS RADIO TRANSMITTER AND RADIO DEVICE

TECHNICAL FIELD

Embodiments of the disclosure generally relate to radio technologies, and, more particularly, to a directional coupler and a method for manufacturing the same as well as a radio transmitter and a radio device.

BACKGROUND

In radio remote unit/head (RRU/RRH) for wireless communication, a power amplifier (PA) is generally used to output an amplified radio frequency (RF) signal. The output RF signal is generally fed back via a directional coupler and an observation receiver to a digital pre-distorter (DPD) so as to compensate the PA's nonlinearity. FIG. 1 shows an example of an existing PA board circuit in RRU. As shown, the existing PA board in RRU includes a Doherty PA 102, a directional coupler 104 and a circulator 106. Note that some RRU components (e.g., the observation receiver, the DPD and so on) are omitted in FIG. 1 for the purpose of brevity. The Doherty PA 102 includes a carrier amplifier 1022 and its matching circuit 1024, a first quarter-wave impedance transformer 1026, a peaking amplifier 1028 and its matching circuit 1030, and a second quarter-wave impedance transformer 1032. The separate directional coupler (e.g., −30 dB coupler) 104 is cascaded with the impedance transformer 1032 to generate a coupled signal. The coupled signal is fed back to the DPD via the observation receiver, as mentioned above. The isolation port of the directional coupler 104 is terminated with impedance $Z_0$, which is also the PA 102's load. The circulator 106 is connected with the directional coupler 104 to guide the output RF signal from the PA 102 to a filter unit (FU) and then to an antenna.

For the above existing solution, there is still some room for improvement.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

One of the objects of the disclosure is to provide an improved coupling solution applicable at least to RRU.

According to one aspect of the disclosure, a novel directional coupler that is trans-coupler (or transforming coupler) is presented. The directional coupler comprises a first transmission line and a second transmission line. The first transmission line is configured to receive an input signal. The second transmission line can be coupled to the first transmission line by electromagnetic coupling to output a coupled signal. The first transmission line is further configured to act as a quarter-wave impedance transformer.

In an embodiment of the disclosure, the quarter-wave impedance transformer implemented by the first transmission line is used for a power amplifier (PA).

In an embodiment of the disclosure, the quarter-wave impedance transformer implemented by the first transmission line is an intrinsic component of the PA.

In an embodiment of the disclosure, the PA is a Doherty PA.

In an embodiment of the disclosure, the input signal has a frequency in a radio frequency (RF) band.

In an embodiment of the disclosure, the first and second transmission lines are microstrip lines disposed in parallel.

According to another aspect of the disclosure, it is provided a radio transmitter. The radio transmitter comprises a PA configured to output an amplified RF signal. The radio transmitter further comprises the directional coupler according to the above aspect. The directional coupler is connected with the PA. The quarter-wave impedance transformer implemented by the first transmission line of the directional coupler is configured to enable an output impedance from the PA to be matched with a system impedance of the radio transmitter.

In an embodiment of the disclosure, the radio transmitter further comprises an observation receiver that is configured to process the coupled signal from the second transmission line of the directional coupler to feed back an observation signal to a digital pre-distorter (DPD). The radio transmitter further comprises the DPD that is configured to generate a pre-distortion based on the observation signal and apply the pre-distortion to an input digital signal to compensate the PA's nonlinearity.

In an embodiment of the disclosure, the quarter-wave impedance transformer implemented by the first transmission line is an intrinsic component of the PA.

In an embodiment of the disclosure, the PA is a Doherty PA.

According to another aspect of the disclosure, it is provided a radio device. The radio device comprises the radio transmitter according to the above aspect.

In an embodiment of the disclosure, the radio device is one of: a radio unit of a base station; and a mobile phone.

According to another aspect of the disclosure, it is provided a method for manufacturing a directional coupler. The method comprises providing a first transmission line. The first transmission line is configured to receive an input signal and act as a quarter-wave impedance transformer. The method further comprises forming a second transmission line such that the second transmission line can be coupled to the first transmission line by electromagnetic coupling to output a coupled signal.

In an embodiment of the disclosure, the quarter-wave impedance transformer implemented by the first transmission line is used for a power amplifier (PA).

In an embodiment of the disclosure, providing the first transmission line comprises providing, as the first transmission line, an intrinsic quarter-wave impedance transformer of the PA.

In an embodiment of the disclosure, the PA is a Doherty PA.

In an embodiment of the disclosure, the first and second transmission lines are microstrip lines disposed in parallel.

These and other objects, features and advantages of the disclosure will become apparent from the following detailed description of illustrative embodiments thereof, which are to be read in connection with the accompanying drawings.

DETAILED DESCRIPTION

For the purpose of explanation, details are set forth in the following description in order to provide a thorough understanding of the embodiments disclosed. It is apparent, however, to those skilled in the art that the embodiments may be implemented without these specific details or with an equivalent arrangement.

Figure 1:
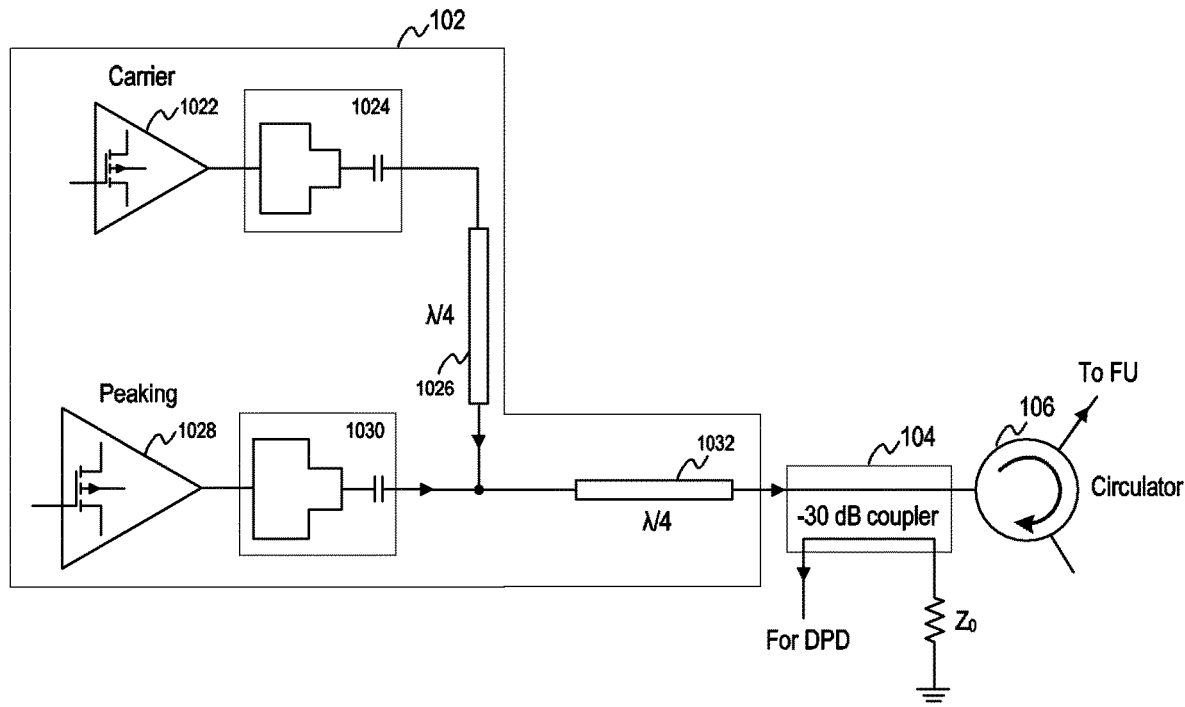
FIG. 1 is a schematic diagram showing an example of an existing PA board in RRU.

In the existing solution shown in FIG. 1, the directional coupler 104 may be surface mount technology (SMT) type or microstrip type. The SMT type coupler is based on low temperature co-fired ceramic (LTCC) or high $\varepsilon_r$ multi-layer circuit techniques, where $\varepsilon_r$ represents relative dielectric constant. It may be purchased from vendors such as Anaren, RN2, EMC-Labs, etc. It is compact in size but high in cost.

Figure 2:
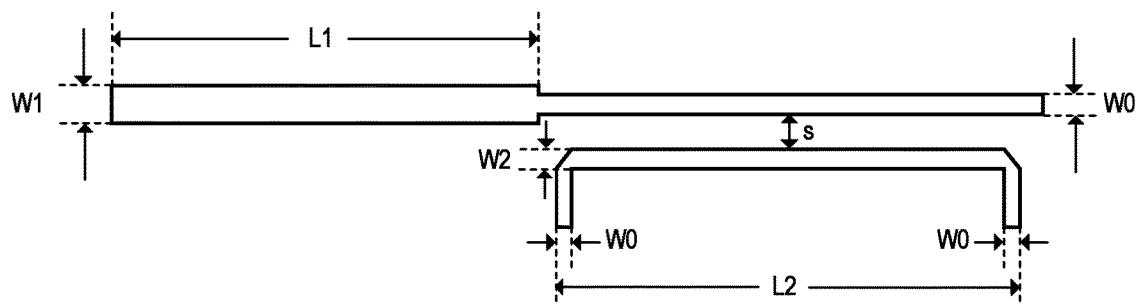
FIG. 2 is a plan view showing the cascaded configuration of an impedance transformer and a directional coupler in the existing RRU PA.

The microstrip type coupler is low in cost because it can be designed and formed on the printed circuit board (PCB) of the PA 102. However, as shown in FIG. 2, the cascaded configuration of the impedance transformer 1032 (with a length of L1) and the directional coupler 104 (with a length of L2) has a total length of (L1+L2) at least. For higher bands such as B41 defined in long term evolution (LTE), the cascaded configuration is still acceptable. But for lower bands such as global system for mobile communication (GSM), LTE B3 and so on, the cascaded configuration takes up a too large size on the PCB. This is because the directional coupler 104 will be too long for the PA's layout due to its quarter-wave coupled microstrips.

The present disclosure proposes at least an improved solution for directional coupler. Hereinafter, the solution will be described in detail with reference to FIGS. 3-8.

Figure 3:
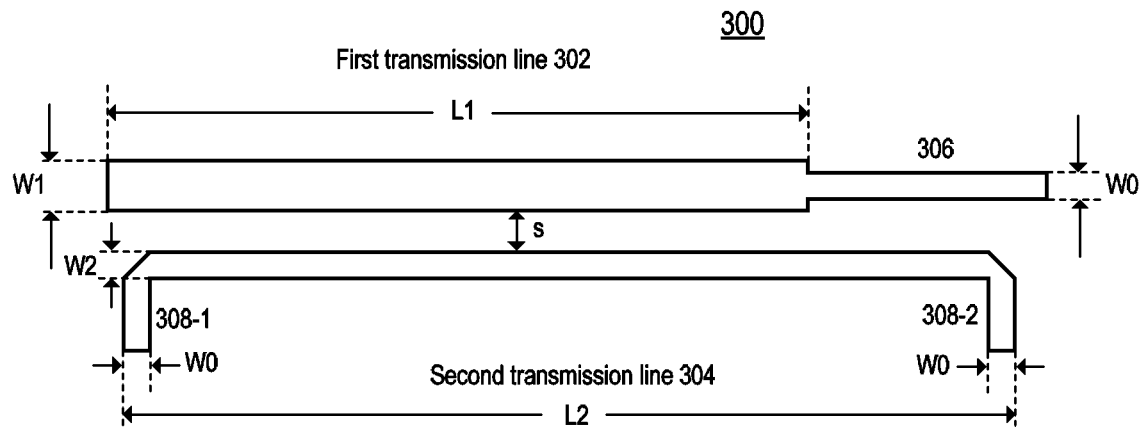
FIG. 3 is a plan view showing a directional coupler according to an embodiment of the disclosure.

FIG. 3 is a plan view showing a directional coupler according to an embodiment of the disclosure. As shown, the directional coupler 300 includes a first transmission line 302 and a second transmission line 304. The first transmission line 302 is configured to receive an input signal. The second transmission line 304 can be coupled to the first transmission line 302 by electromagnetic coupling to output a coupled signal. In other words, the first transmission line 302 serves as a main line and the second transmission line 304 serves as a coupling line. In addition to the function of being the main line of the coupler, the first transmission line 302 is further configured to act as a quarter-wave impedance transformer corresponding to the input signal. In this way, the directional coupler 300 can realize both impedance transforming and coupling functions. Thus, it may also be referred to as a transforming coupler hereinafter.

Take microstrip type as an example. The first transmission line 302 may be implemented as a first microstrip having a length of L1 and a width of W1. The second transmission line 304 may be implemented as a second microstrip having a length of L2 and a width of W2. In this example, since W2 is smaller than W1, asymmetrical coupled microstrips are employed. It should be noted that depending on the specific application scenarios, it is also possible that W2 is greater than or equal to W1. The two transmission lines 302 and 304 may be disposed in parallel. The gap s between the two transmission lines 302 and 304 is configured to enable the electromagnetic coupling therebetween. Note that the microstrips 306, 308-1 and 308-2 with a width of W0 are used as connection lines.

Figure 4:
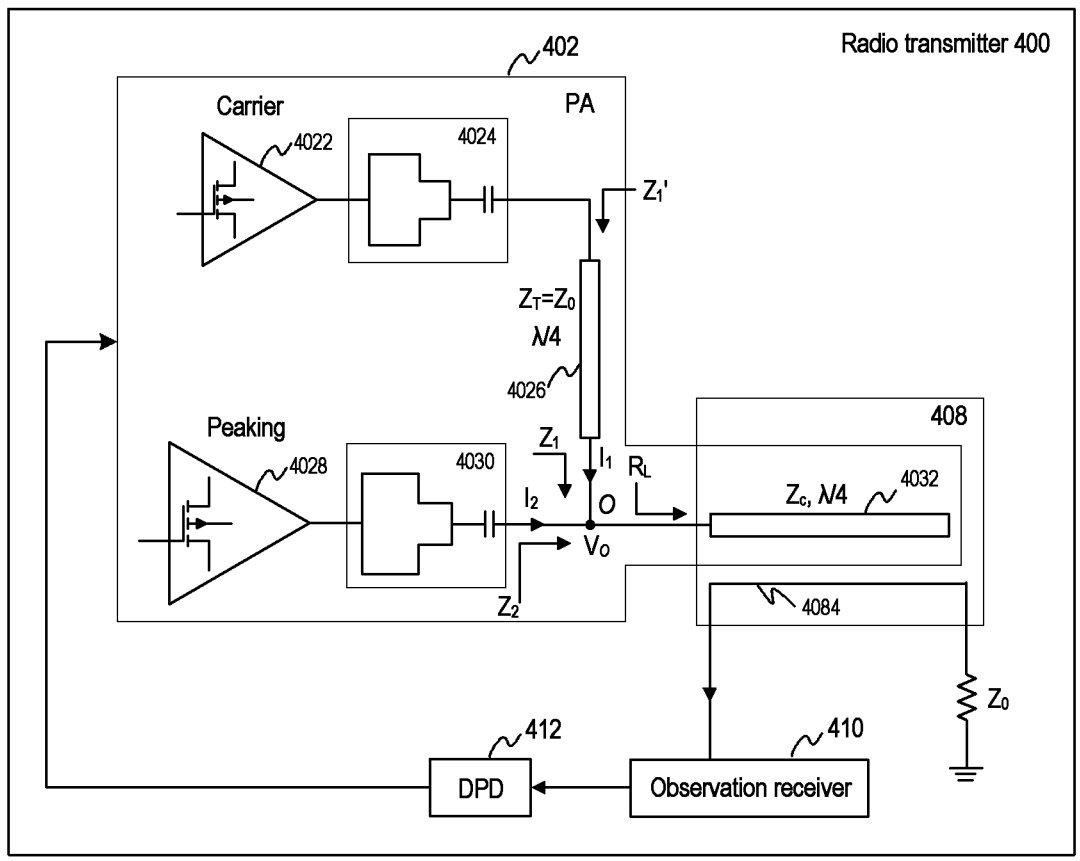
FIG. 4 is a schematic diagram showing a radio transmitter according to an embodiment of the disclosure.

FIG. 4 is a schematic diagram showing a radio transmitter according to an embodiment of the disclosure. As shown, the radio transmitter 400 includes a PA 402, a transforming coupler 408, an observation receiver 410 and a DPD 412. The PA 402 is configured to output an amplified RF signal. Hereinafter, the PA 402 will be described by taking a Doherty PA as an example. Those skilled in the art will understand that the principle of the present disclosure can also be applied to any other suitable PA.

The Doherty PA 402 may be implemented by using various Doherty techniques. As an exemplary example, it may include a carrier amplifier 4022, a first matching circuit 4024 for the carrier amplifier 4022, a first quarter-wave impedance transformer 4026, a peaking amplifier 4028, a second matching circuit 4030 for the peaking amplifier 4028, and a second quarter-wave impedance transformer 4032. The analysis on the Doherty PA 402 will be provided later.

The transforming coupler 408 includes the second quarter-wave impedance transformer 4032 and a second transmission line 4084. The second quarter-wave impedance transformer 4032 is configured to match the output impedance $R_L$ from the PA 402 at the combining point O to the system impedance $Z_0$ of the radio transmitter 400. The impedance transformer 4032 also serves as the first transmission line of the transforming coupler 408. That is, the transforming coupler 408 utilizes the Doherty PA 402's intrinsic quarter-wave impedance transformer 4032 as its main line or signal line. The transforming coupler 408 may be implemented as the directional coupler 300 described above. In this case, the second transmission line 4084 may be formed on the PCB of the PA 402.

In this way, the traditional impedance transformer and directional coupler are combined into one structure called transforming coupler. Its structure is simple and is easy to be laid out on the PCB. It can reduce the PA 402's layout size since it has no need to occupy an additional length as the existing cascaded configuration. Further, it is cost saving due to the size reduction. To sum up, this novel coupling solution/configuration can achieve the purpose of both size and cost reduction, especially for lower bands such as GSM, LTE B3 and so on.

The observation receiver 410 is configured to process the coupled signal from the second transmission line 4084 of the transforming coupler 408 to feed back an observation signal to the DPD 412. The observation receiver 410 may also be referred to as an observation path receiver. As an example, it may include a RF downconverting mixer, an intermediate frequency (IF) amplifier, a bandpass filter and an analog to digital converter (ADC).

The DPD 412 is configured to generate a pre-distortion based on the observation signal and apply the pre-distortion to an input digital signal to compensate the PA 402's nonlinearity. The DPD 412 may be implemented by using various DPD algorithms.

Figure 5:
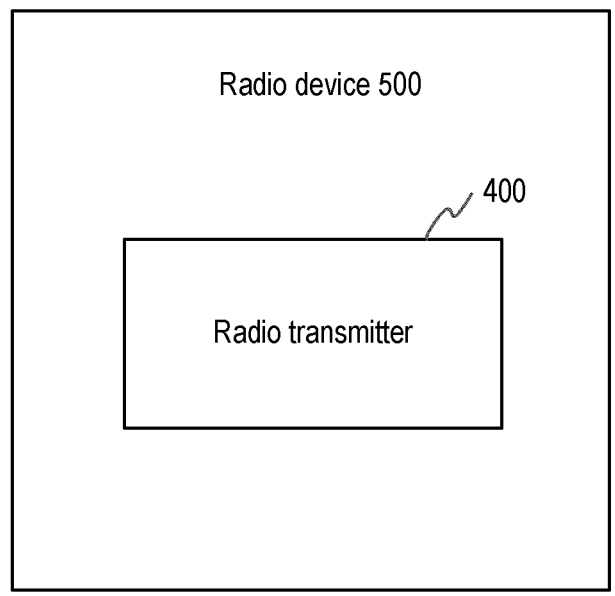
FIG. 5 is a block diagram showing a radio device according to an embodiment of the disclosure.

FIG. 5 is a block diagram showing a radio device according to an embodiment of the disclosure. As shown, the radio device 500 includes the radio transmitter 400 described above. As an example, the radio device 500 may be a radio unit (e.g., RRU/RRH) of a base station. As another example, the radio device 500 may be a mobile phone. The other configurations of the RRU/RRH or the mobile phone may be well known to those skilled in the art, and thus the detailed description thereof is omitted here.

Now the design procedure will be described for the transforming coupler 408. As an exemplary example, assume the transforming coupler 408 is a −30 dB coupler, the PA 402 is a typical asymmetrical Doherty PA with a power ratio of 1:1.4, and the PA 402 operates at GSM band, i.e. 935-960 MHz. It should be noted that the solution according to the present disclosure can also be applied to other bands and other Doherty PAs with different power ratios such as 1:1.

At the first step, the impedances in the PA 402 are calculated. Since the carrier and peaking amplifiers 4022 and 4028 may be deemed as two voltage-controlled current sources, the voltage $V_o$ at the combining point O may be represented as:

$$V_o = (I_1 + I_2) \cdot R_L,$$

where $I_1$ is the current flowing through the carrier branch, $I_2$ is the current flowing through the peaking branch, and $R_L$ is PA 402's output impedance at the combining point O. Thus, the first impedance $Z_1$ seen from the carrier branch may be represented as:

$$Z_1 = \frac{V_o}{I_1} = \left(1 + \frac{I_2}{I_1}\right) R_L.$$

The second impedance $Z_2$ seen from the peaking branch may be represented as:

$$Z_2 = \frac{V_o}{I_2} = \left(1 + \frac{I_1}{I_2}\right) R_L.$$

The saturated output power $P_1$ from the carrier branch may be represented as:

$$P_1 = V_o \cdot I_1.$$

The saturated output power $P_2$ from the peaking branch may be represented as:

$$P_2 = V_o \cdot I_2.$$

Then, the output power ratio n may be represented as:

$$n = \frac{P_2}{P_1} = \frac{I_2}{I_1}.$$

Since the saturated power ratio n between the peaking and carrier branch is known (n=1.4 as mentioned above), the impedances $Z_1$ and $Z_2$ may be represented as:

$$Z_1 = (1+n) R_L,$$

$$Z_2 = \left(1 + \frac{1}{n}\right) R_L.$$

Since the first quarter-wave impedance transformer 4026 is connected between the carrier amplifier 4022 and the combining point O, the load impedance $Z_1'$ for the carrier amplifier 4022 may be represented as:

$$Z_1' = \frac{Z_T^2}{Z_1},$$

where $Z_T$ is the characteristic impedance of the impedance transformer 4026. Typically, $Z_T$ is assigned to be $Z_0$=50Ω, where $Z_0$ is the system impedance of the radio transmitter 400. Typically, the carrier amplifier 4022 is matched to $Z_0$, that is, $Z_1'$ equals $Z_0$. Thus, the first impedance $Z_1$ may be determined as $Z_1 = Z_0 = 50\Omega$.

Then, the output impedance $R_L$ at the combining point O may be calculated as:

$$R_L = \frac{Z_1}{(1+n)} = \frac{50}{(1+1.4)} = 20.8\Omega.$$

Since the second quarter-wave impedance transformer 4032 is connected between the combining point O and the PA 402's system load impedance $Z_0$, the characteristic impedance $Z_c$ of the impedance transformer 4032 may be calculated as:

$$Z_c = \sqrt{R_L Z_0} = \sqrt{20.8 \cdot 50} = 32.3\Omega.$$

Then, at the second step, the physical sizes of the second quarter-wave impedance transformer 4032 are calculated based at least on the calculated impedance from the first step. For example, the relation between the characteristic impedance $Z_c$ and the width W1 of the impedance transformer 4032 may be represented as follows:

$$Z_c = \frac{120\pi\Omega}{\sqrt{\varepsilon_e}\,[W'/h + 1.393 + 0.667\ln(W'/h + 1.444)]},$$

$$\varepsilon_e = \frac{\varepsilon_r + 1}{2} + \frac{\varepsilon_r - 1}{2} \frac{1}{\sqrt{1 + 12h/W1}} - \frac{\varepsilon_r - 1}{4.6} \frac{t/h}{\sqrt{W1/h}},$$

$$\frac{W'}{h} = \frac{W1}{h} + \frac{1.25}{\pi} \frac{t}{h}\left(1 + \ln\frac{2h}{t}\right),$$

where $\varepsilon_e$ is the effective dielectric constant of the microstrip line 4032, W' is an intermediate parameter, h is the thickness of the PCB substrate for the PA 402, $\varepsilon_r$ is the relative dielectric constant of the PCB substrate, and t is the thickness of the microstrip line 4032.

As an exemplary example, a typical RO4350B substrate may be used as the PCB substrate. It may be purchased from Rogers and has a relative dielectric constant $\varepsilon_r$=3.66 and a thickness h=0.762 mm. The thickness t of the microstrip line 4032 may take a typical value of 35 μm. Then, the width W1 can be calculated from the characteristic impedance $Z_c$ (=32.3Ω) according to the above three equations.

The length L1 of the impedance transformer 4032 may be calculated as:

$$L1 = \frac{\lambda}{4} = \frac{\frac{v}{f}}{4} = \frac{\frac{1}{\sqrt{\mu\varepsilon}}}{4f} = \frac{\frac{c}{\sqrt{\mu_r \varepsilon_r}}}{4f},$$

where λ is the wavelength of the RF signal traveling in substrate, v and f are the velocity and frequency of the RF signal respectively, μ and ε are the permeability and dielectric constant of the PCB substrate respectively, c is the speed of electromagnetic wave in vacuum, and $\mu_r$ is the relative permeability of the PCB substrate. It should be noted that the physical dimensions of the impedance transformer 4032 may also be calculated by virtue of tools such as ADS (Advanced Design System) and AWR (Applied Wave Research).

Then, at the third step, the impedances in the transforming coupler 408 are calculated. Specifically, its even-mode and odd-mode impedances may be represented as:

$$C(-dB) = 20 \log k \Rightarrow k = 10^{\frac{C}{20}},$$

$$Z_{0e} = Z_0 \sqrt{\frac{1+k}{1-k}},$$

$$Z_{0o} = Z_0 \sqrt{\frac{1-k}{1+k}},$$

where C(-dB) denotes the coupling level in -dB, k is the coupling factor, $Z_{0e}$ and $Z_{0o}$ are the even-mode and odd-mode impedances for the coupled lines 4084 and 4032. Since the transforming coupler 408 is assumed to be -30 dB coupler, C=-30 dB. Thus, k, $Z_{0e}$ and $Z_{0o}$ may be calculated as:

$$k = 10^{\frac{C}{20}} = 10^{-\frac{3}{2}} = 0.032,$$

$$Z_{0e} = 50 \times \sqrt{\frac{1+0.032}{1-0.032}} = 51.6\Omega,$$

$$Z_{0o} = 50 \times \sqrt{\frac{1-0.032}{1+0.032}} = 48.44\Omega.$$

Then, at the fourth step, the physical structure of the transforming coupler 408 is calculated according to the calculated impedances from the third step. For example, the tools such as ADS and AWR may be used to obtain the corresponding asymmetrical coupled microstrip structures (e.g., the length L2, the width W2 and the gap s shown in FIG. 3) from the even-mode and odd-mode impedances.

Then, at the fifth step, full-wave electromagnetic (EM) simulation and optimization may be performed. For example, according to the initial dimensions obtained by the first to fourth steps, physical structures may be constructed with the aid of CAD (Computer Aided Design). The simulation and optimization may be implemented by using HFSS (High Frequency Structure Simulator) which is a full-wave EM solver from Ansoft. The following Table 1 shows the final optimal dimensions of the proposed exemplary -30 dB transforming coupler.

TABLE 1

Dimensions of the proposed transforming coupler

| Parameter | W0 | W1 | W2 | L1 | L2 | s |
|---|---|---|---|---|---|---|
| Unit (mm) | 1.65 | 3.14 | 1.63 | 44 | 52 | 2.6 |

In addition, for the purpose of comparison, the inventors also calculated the dimensions of the existing cascaded configuration, under the same assumption that the directional coupler is a -30 dB coupler, the PA is a typical asymmetrical Doherty PA with a power ratio of 1:1.4, and the PA operates at GSM band, i.e. 935-960 MHz. The following Table 2 shows the calculated dimensions of the existing cascaded configuration.

TABLE 2

Dimensions of the existing cascaded configuration

| Parameter | W0 | W1 | W2 | L1 | L2 | s |
|---|---|---|---|---|---|---|
| Unit (mm) | 1.65 | 3.14 | 1.63 | 46 | 50 | 2.75 |

Similar to Table 1, L2 is the length of the directional coupler 104, W2 is the width of the coupling line of the directional coupler 104, and s is the distance between the signal line and the coupling line of the coupler 104.

From Table 1, it can be seen that W2 (1.63 mm) is smaller than W1 (3.14 mm). Thus, asymmetrical coupled structures are adopted in this novel -30 dB transforming coupler. In contrast, from Table 2, it can be seen that W2 (1.63 mm) is basically equal to W0 (1.65 mm). Actually symmetrical coupled structures are adopted in the existing solution.

Further, it can be seen that the proposed transforming coupler has a length of about 52 mm, while the existing cascaded configuration has a length of about 96 mm (=46 mm+50 mm). Apparently, the proposed transforming coupler can substantially reduce the Doherty PA's layout compared to the existing cascaded configuration.

Further, considering the coupling level mainly depends on the gap s (the distance between the signal line and the coupling line), the width W1 of the signal line 4032 in the proposed solution is designated to be the same as the width of the impedance transformer 1032 in the existing solution. In this way, the intrinsic impedance transformer in the Doherty PA can be effectively utilized.

Figure 6A:
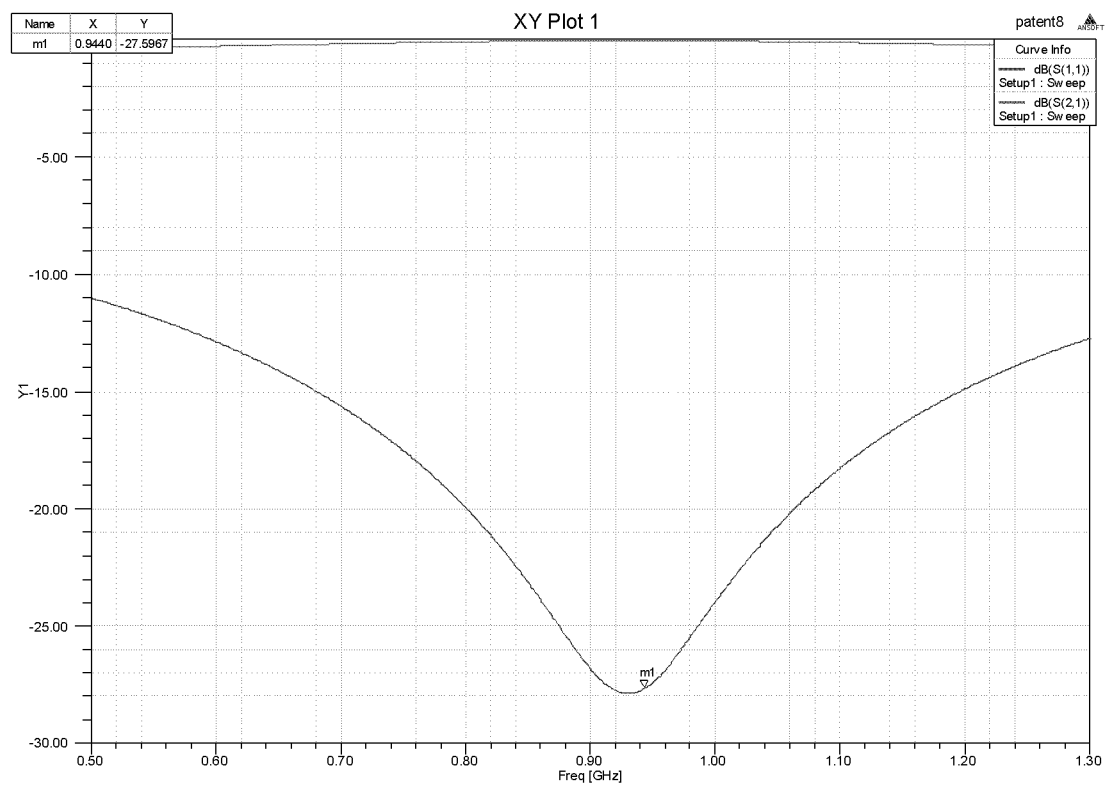
FIGS. 6A-6C show the characteristic curves simulated for a solution according to an embodiment of the disclosure.
Figure 6B:
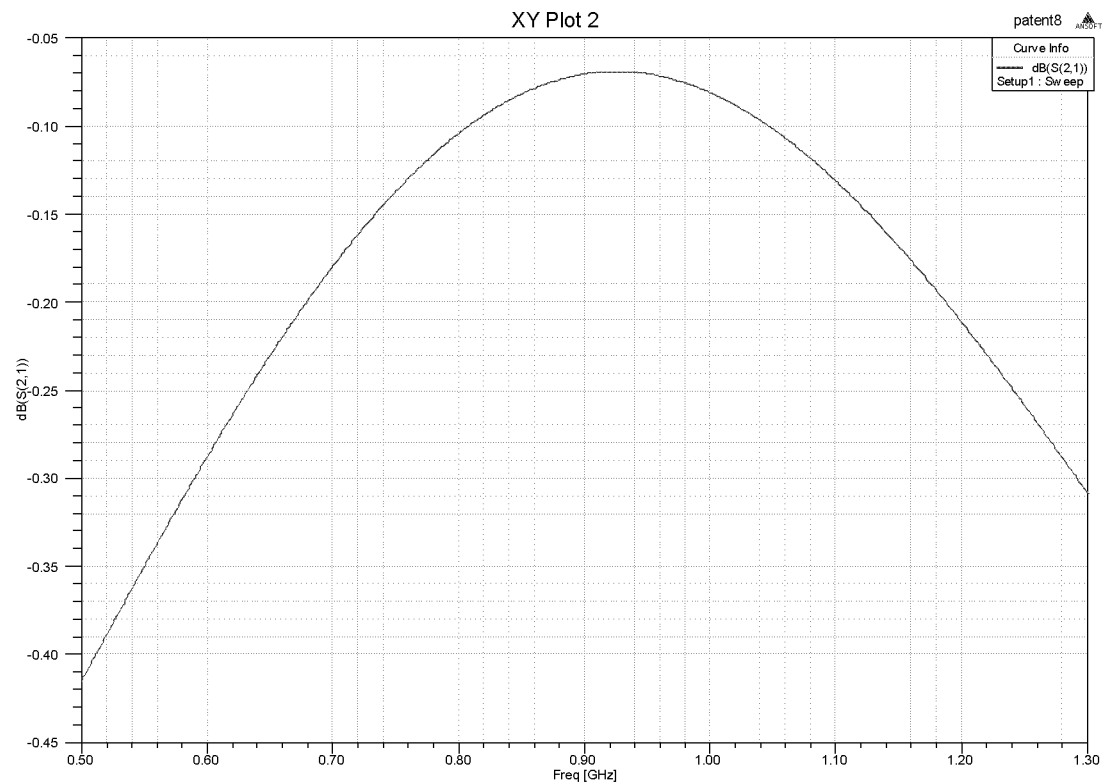
Figure 6C:
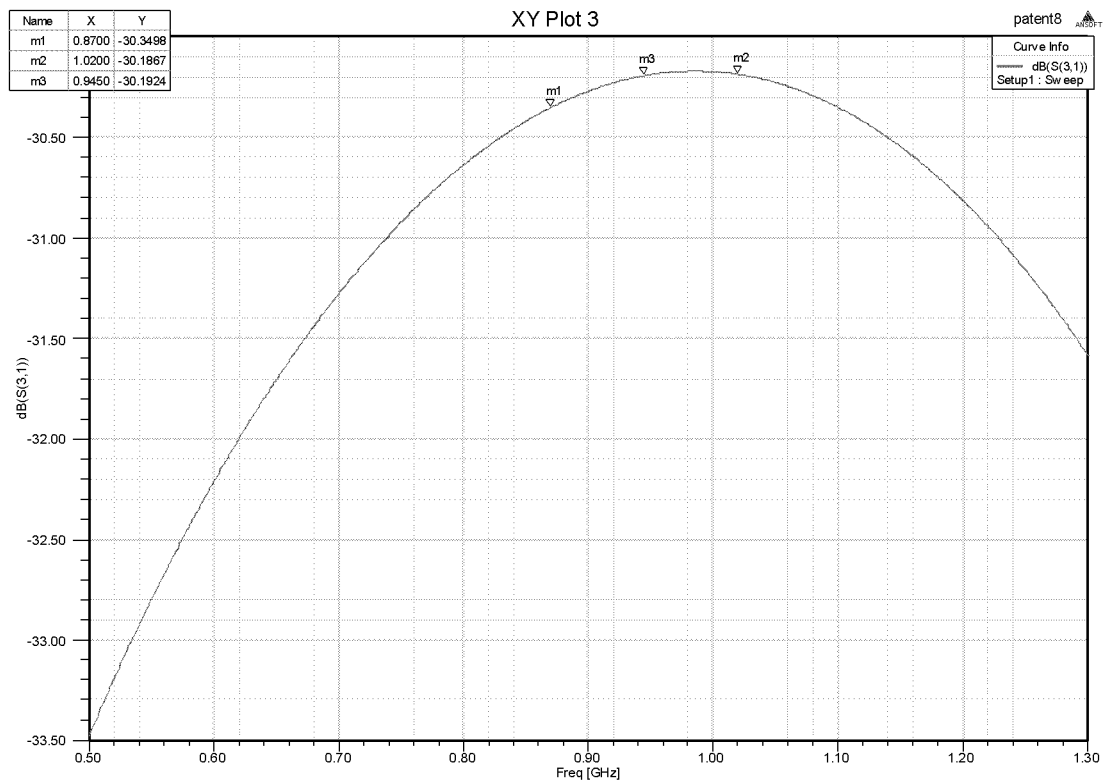
Figure 7A:
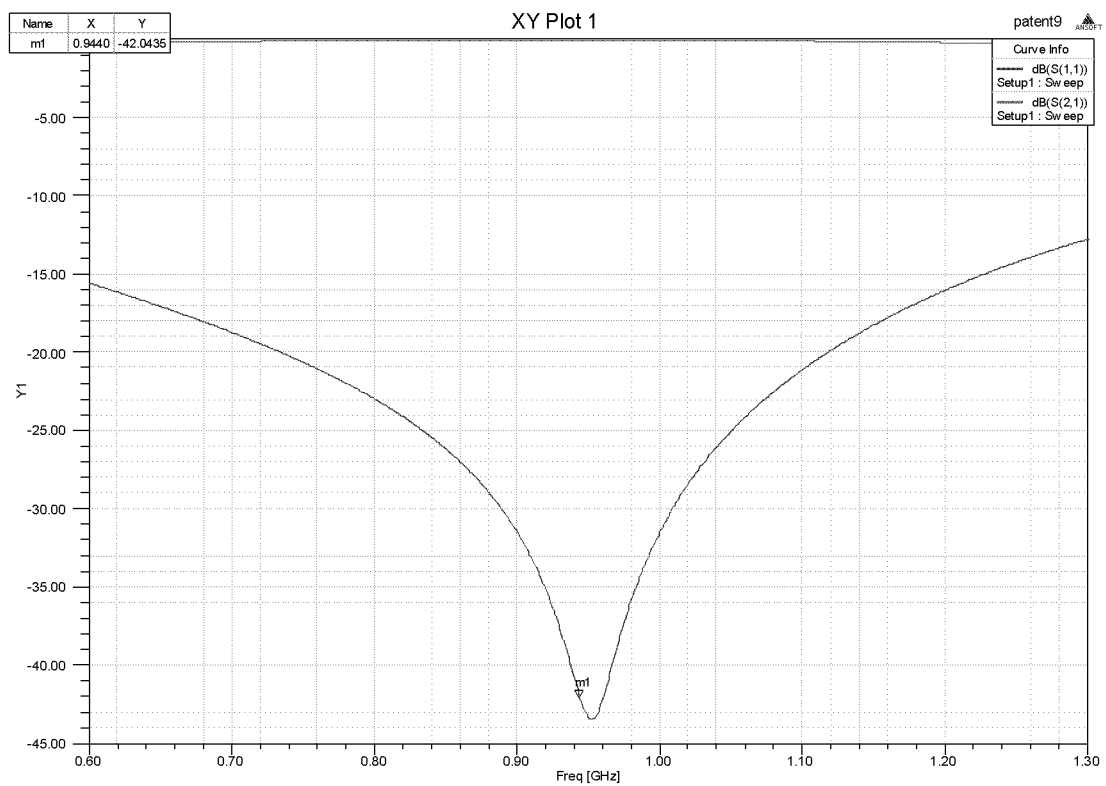
FIGS. 7A-7C show the characteristic curves simulated for the existing solution.
Figure 7B:
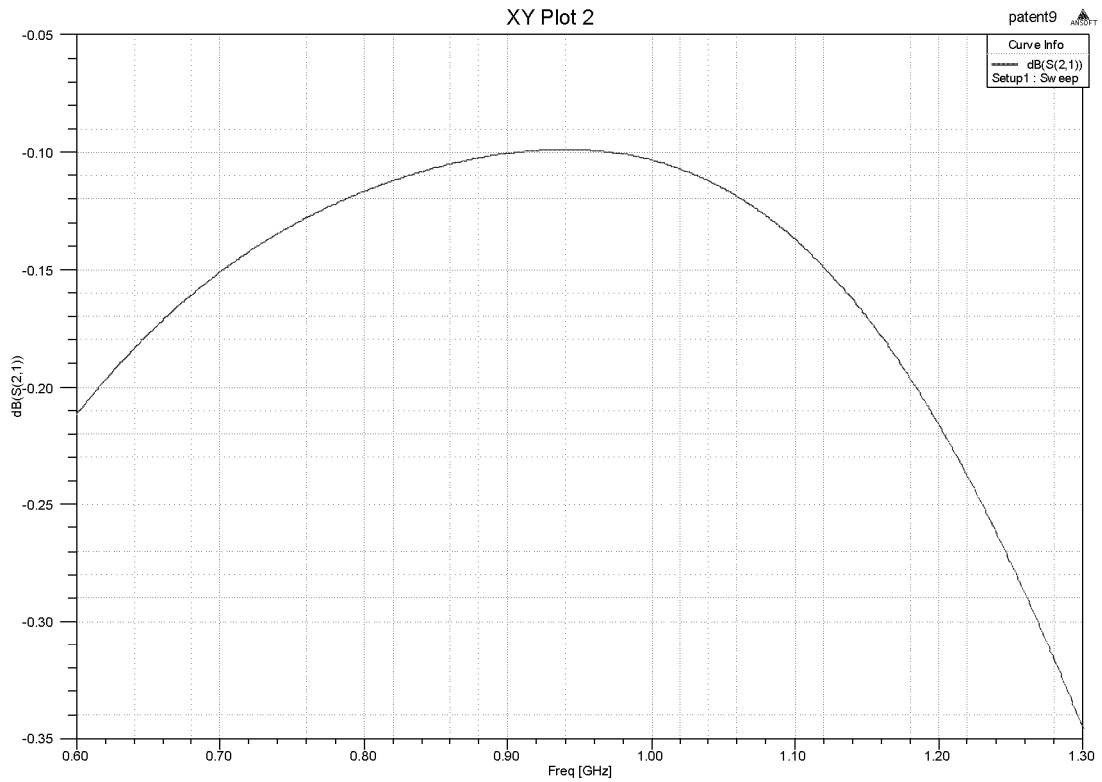
Figure 7C:
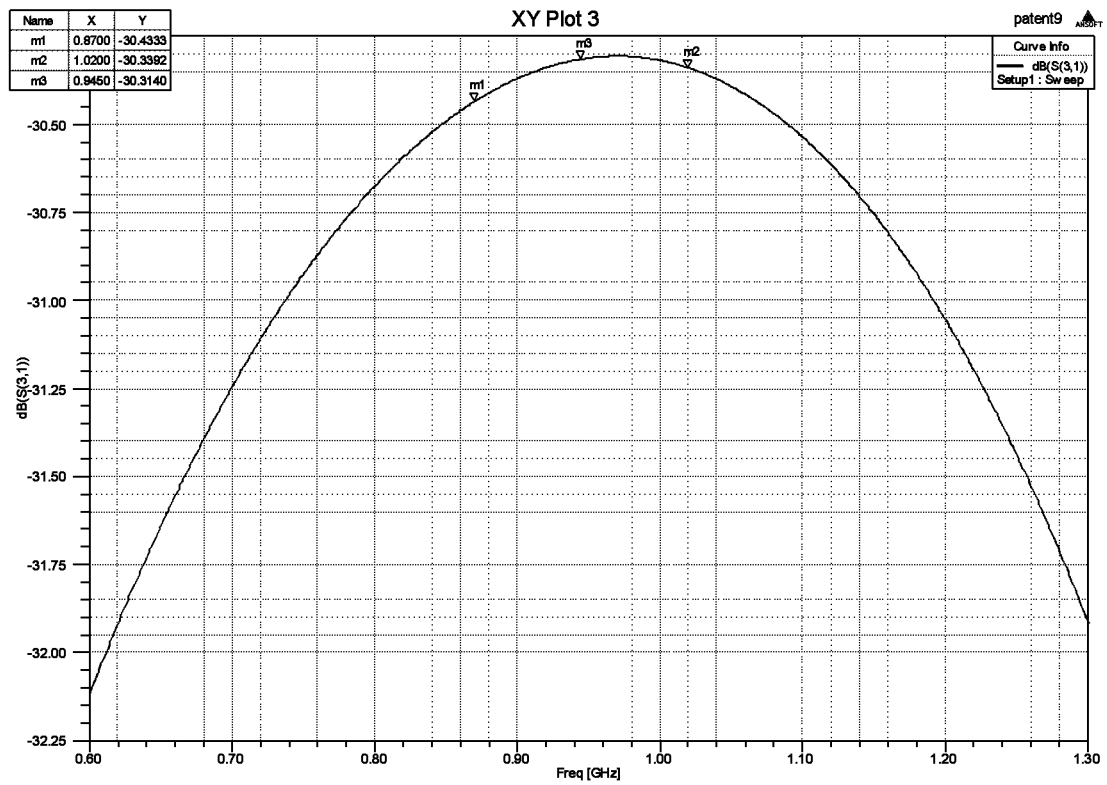

In addition, the parameters S11, S21 and S31 were simulated in HFSS for the proposed solution and the existing solution, respectively. FIGS. 6A-6C show the simulated results of S11, S21 and S31 for the proposed solution respectively. FIGS. 7A-7C show the simulated results of S11, S21 and S31 for the existing solution respectively. The parameter S11 represents the input reflection coefficient. The parameter S21 represents the forward transmission coefficient. The parameter S31 represents the backward coupling level. These three parameters are the main parameters for characterizing a directional coupler. By comparison, it can be seen that the proposed solution has almost the same response as the existing solution. This means that the transforming coupler 408 can replace the existing cascaded configuration while achieving both size and cost reduction.

Figure 8:
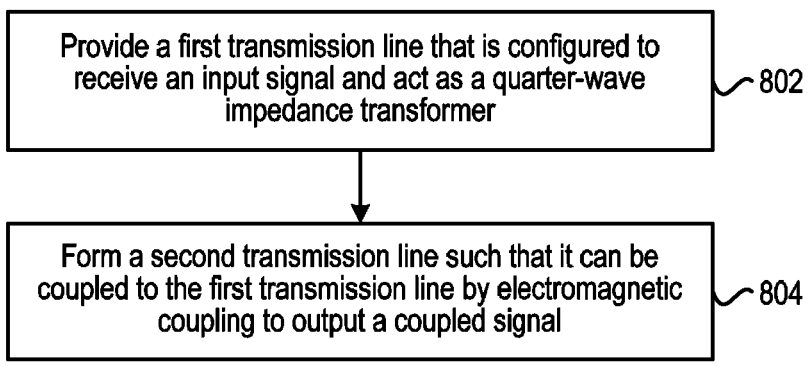
FIG. 8 is a flowchart illustrating a method for manufacturing a directional coupler according to an embodiment of the disclosure.

FIG. 8 is a flowchart illustrating a method for manufacturing a directional coupler according to an embodiment of the disclosure. At step 802, a first transmission line is provided. The first transmission line is configured to receive an input signal and act as a quarter-wave impedance transformer. As an example, the quarter-wave impedance transformer implemented by the first transmission line may be used for a PA. In case the PA has an intrinsic quarter-wave impedance transformer, this intrinsic impedance transformer may be directly used as the first transmission line of the directional coupler.

At step 804, a second transmission line is formed such that the second transmission line can be coupled to the first transmission line by electromagnetic coupling to output a coupled signal. The implementing details of the first and second transmission lines have been detailed hereinbefore and are omitted here for brevity. It should be noted that although step 804 is shown to be subsequent to step 802, it is also possible that the second transmission line is formed prior to or simultaneously with the first transmission line.

In general, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the disclosure is not limited thereto. While various aspects of the exemplary embodiments of this disclosure may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

As such, it should be appreciated that at least some aspects of the exemplary embodiments of the disclosure may be practiced in various components such as integrated circuit chips and modules. It should thus be appreciated that the exemplary embodiments of this disclosure may be realized in an apparatus that is embodied as an integrated circuit, where the integrated circuit may comprise circuitry (as well as possibly firmware) for embodying at least one or more of a data processor, a digital signal processor, baseband circuitry and radio frequency circuitry that are configurable so as to operate in accordance with the exemplary embodiments of this disclosure.

It should be appreciated that at least some aspects of the exemplary embodiments of the disclosure may be embodied in computer-executable instructions, such as in one or more program modules, executed by one or more computers or other devices. Generally, program modules include routines, programs, objects, components, data structures, etc. that perform particular tasks or implement particular abstract data types when executed by a processor in a computer or other device. The computer executable instructions may be stored on a computer readable medium such as a hard disk, optical disk, removable storage media, solid state memory, RAM, etc. As will be appreciated by one of skill in the art, the function of the program modules may be combined or distributed as desired in various embodiments. In addition, the function may be embodied in whole or in part in firmware or hardware equivalents such as integrated circuits, field programmable gate arrays (FPGA), and the like.

References in the present disclosure to "one embodiment", "an embodiment" and so on, indicate that the embodiment described may include a particular feature, structure, or characteristic, but it is not necessary that every embodiment includes the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

It should be understood that, although the terms "first", "second" and so on may be used herein to describe various elements, these elements should not be limited by these terms. These terms are only used to distinguish one element from another. For example, a first element could be termed a second element, and similarly, a second element could be termed a first element, without departing from the scope of the disclosure. As used herein, the term "and/or" includes any and all combinations of one or more of the associated listed terms.

The terminology used herein is for the purpose of describing particular embodiments only and is not intended to limit the present disclosure. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components, but do not preclude the presence or addition of one or more other features, elements, components and/or combinations thereof. The terms "connect", "connects", "connecting" and/or "connected" used herein cover the direct and/or indirect connection between two elements.

The present disclosure includes any novel feature or combination of features disclosed herein either explicitly or any generalization thereof. Various modifications and adaptations to the foregoing exemplary embodiments of this disclosure may become apparent to those skilled in the relevant arts in view of the foregoing description, when read in conjunction with the accompanying drawings. However, any and all modifications will still fall within the scope of the non-Limiting and exemplary embodiments of this disclosure.

What is claimed is:

1. A directional coupler comprising:
a first transmission line configured to receive an input signal; and
a second transmission line that can be coupled to the first transmission line by electromagnetic coupling to output a coupled signal,
wherein the first transmission line is further configured to act as a quarter-wave impedance transformer, and
wherein the quarter-wave impedance transformer implemented by the first transmission line is an intrinsic component of a power amplifier (PA).

2. The directional coupler according to claim 1, wherein the PA is a Doherty PA.

3. The directional coupler according to claim 1, wherein the input signal has a frequency in a radio frequency (RF) band.

4. The directional coupler according to claim 1, wherein the first and second transmission lines are microstrip lines disposed in parallel.

5. A radio transmitter comprising:
a power amplifier (PA) configured to output an amplified radio frequency (RF) signal; and
the directional coupler according to claim 1, wherein:
the directional coupler is connected with the PA, and
the quarter-wave impedance transformer implemented by the first transmission line of the directional coupler is configured to match an output impedance of the PA with the radio transmitter's system load impedance.

6. The radio transmitter according to claim 5, further comprising:
- an observation receiver configured to process the coupled signal from the second transmission line of the directional coupler to feed back an observation signal to a digital pre-distorter (DPD); and
- the DPD that is configured to generate a pre-distortion based on the observation signal and apply the pre-distortion to an input digital signal to compensate the PA's nonlinearity.

7. The radio transmitter according to claim 5, wherein the PA is a Doherty PA.

8. A radio device comprising the radio transmitter according to claim 5.

9. The radio device according to claim 8, wherein the radio device is one of the following: a radio unit (RU) of a base station, or a mobile phone.

10. The radio device according to claim 8, wherein the first and second transmission lines are microstrip lines disposed in parallel.

11. The radio device according to claim 8, wherein the PA is a Doherty PA.

12. The radio transmitter according to claim 5, wherein the first and second transmission lines are microstrip lines disposed in parallel.

* * * * *